United States Patent [19]
Ito et al.

[11] Patent Number: 5,497,120
[45] Date of Patent: Mar. 5, 1996

[54] DIFFERENTIAL AMPLIFIER CIRCUIT HAVING A BIAS CIRCUIT WITH A DIFFERENTIAL AMPLIFIER

[75] Inventors: Masao Ito, Itami; Takahiro Miki, Kawanishi, both of Japan

[73] Assignee: Mitsubishi Denki Kabushiki Kaisha, Tokyo, Japan

[21] Appl. No.: 350,030

[22] Filed: Nov. 29, 1994

[30]  Foreign Application Priority Data

Dec. 21, 1993 [JP] Japan .................................. 5-322592
Jul. 7, 1994 [JP] Japan .................................. 6-155823

[51] Int. Cl.$^6$ ........................... H03K 17/16; H03F 3/45
[52] U.S. Cl. .......................... 327/563; 327/541; 327/543; 330/253; 330/261
[58] Field of Search .............................. 327/65, 561, 562, 327/563, 52, 66, 67, 538, 540, 543, 545, 546, 541; 330/253, 257, 261

[56]  References Cited

U.S. PATENT DOCUMENTS

| | | | |
|---|---|---|---|
| 5,061,862 | 10/1991 | Tamagawa .............................. | 327/563 |
| 5,065,046 | 11/1991 | Mok ........................................... | 327/65 |
| 5,124,580 | 6/1992 | Matthews et al. ...................... | 327/538 |
| 5,187,448 | 2/1993 | Brooks et al. ........................... | 330/253 |
| 5,202,645 | 4/1993 | Phan et al. ............................... | 330/257 |
| 5,367,201 | 11/1974 | Hedberg ................................... | 327/543 |

Primary Examiner—Timothy P. Callahan
Assistant Examiner—Terry L. Englund
Attorney, Agent, or Firm—Oblon, Spivak, McClelland, Maier & Neustadt

[57]  ABSTRACT

A differential amplifier circuit is obtained in which an operating power source voltage is suppressed to a minimum necessary level. The differential amplifier circuit includes a bias circuit having a differential amplifier with NMOS transistors (11A, 11B, 12A and 12B) and PMOS transistors (13A and 13B). Sources of NMOS transistors (11A) and (11B) are commonly grounded. A bias voltage (VB1) is supplied to gates of the NMOS transistors (11A) and (11B). Drains of the NMOS transistors (11A) and (11B) are connected to sources of NMOS transistors (12A) and (12B), respectively. A gate and a drain of the NMOS transistor (12A) are short-circuited to each other with the drain connected to a drain of a PMOS transistor (13A). A bias voltage (VB4) is applied to a gate of the NMOS transistor (12B). A drain of the NMOS transistor (12B) is connected to a drain of the PMOS transistor (13B) whose gate and drain are shared by each other. Gates of the PMOS transistors (13A) and (13B) are connected to a bias terminal (72) while sources of the PMOS transistors (13A) and (13B) are commonly connected to a power source. The bias terminal (72) is connected to an input bias terminal of a differential amplifier.

15 Claims, 11 Drawing Sheets

DIFFERENTIAL AMPLIFIER CIRCUIT HAVING A BIAS CIRCUIT WITH A DIFFERENTIAL AMPLIFIER

BACKGROUND OF THE INVENTION

FIELD OF THE INVENTION

The present invention relates to a differential amplifier circuit which is used in an A/D convertor for the purpose of comparing voltages and other purposes.

DESCRIPTION OF THE BACKGROUND ART

An A/D convertor, a convertor which converts an analog signal into a digital signal, incorporated in a semiconductor integrated circuit device often includes a differential amplifier circuit as a voltage comparator for comparing a potential of an input signal and a potential of a reference signal.

In general, a differential amplifier circuit is relatively immune to a power source noise as compared with an invertor-type amplifier. For this reason, a differential amplifier circuit is extensively used as a voltage comparator in a high-resolution A/I) convertor which is required to accurately compare voltages. In the field of electronic equipment for public use, it is desirable to form both an A/D convertor and a semiconductor integrated circuit device which processes a digital signal on the same semiconductor substrate so that manufacturing costs and the mounting area for the semiconductor integrated circuit device are reduced and a noise in a digital signal bus line on a board which mounts various types of semiconductor integrated circuit devices causes less interference. Hence, since it is particularly important to suppress noise which is transmitted from the semiconductor integrated circuit device which processes a digital signal through the semiconductor substrate, use of a differential amplifier circuit which is insensitive to noise is preferable. Use of a differential amplifier circuit which is constructed to reduce a power source voltage is preferable because of a need for a reduction in the power source voltage for application to battery driving electric equipment.

FIG. 6 is a circuitry diagram showing a structure of a voltage comparator which uses a conventional differential amplifier circuit. In FIG. 6, the voltage comparator is comprised of an input part 1 and an amplification part 2. The input part 1 includes an input terminal 101 and an input terminal 102 for receiving a voltage-to-be-compared $V_{IN}$ and a comparing voltage $V_{CM}$, respectively, from outside. The input terminal 101 is connected to a node N1 which serves as an output terminal through a switch SW1 while the input terminal 102 is connected to the node N1 through a switch SW2. The switch SW1 turns on and off under the control of a control signal $\phi 1$. The switch SW2 turns on and off under the control of a control signal $\phi 2$.

An input terminal of the amplification part 2 is the node N1. The amplification part 2 is connected from this node N1 to a first input terminal 21 of a differential amplifier 3 through a coupled capacitance CC1. A second input terminal 22 of the differential amplifier 3 is grounded through a coupled capacitance CC2.

A negative input to the differential amplifier 3 is coupled to the first input terminal 21. An inverse output generated from the negative input is outputted to outside at a first output terminal 41 and returned to the first input terminal 21 through a switch SW31. A positive input to the differential amplifier 3 is coupled to the second input terminal 22. A non-inverting output generated from the positive input is outputted to outside at a second output terminal 42 and returned to the second input terminal 22 through a switch SW32.

To the differential amplifier 3, a bias voltage VB1 and a bias voltage VB2 are supplied respectively through a bias terminal 71 and a bias terminal 72.

FIG. 7 is a timing chart showing an operation of the voltage comparator of FIG. 6. In the following, an operation of the voltage comparator will be described with reference to FIG. 7. During an auto zero period AZ with the control signal $\phi 1$ staying at "1" level and a control signal $\phi 2$ staying at "0" level, the switches SW1, SW31 and SW32 are in ON state and the switch SW2 is in OFF state. This allows the voltage-to-be-compared $V_{IN}$ to be supplied from the input terminal 101 of the input part 1. At the same time with this, a non-inverted input and a non-inverted output of the differential amplifier 3 are shorted to each other, and an inverted input and an inverted output of the differential amplifier 3 are also shorted to be each other.

As a result, potentials of shorted input and outputs are determined by a balance voltage $V_{BS}$ which is expressed by an intersection M of an input/output characteristic of an amplifier of FIG. 8 and a line L which satisfies a condition of "Input voltage=Output voltage." Hence, during the auto zero period AZ, the coupled capacitance CC1 is charged by the voltage-to-be-compared $V_{IN}$ and the balance voltage $V_{BS}$.

On the other hand, during a voltage comparison period CM with the control signal $\phi 1$ staying at "0" level and the control signal $\phi 2$ staying at "1" level, the switch SW2 is in ON state and the switches SW1, SW31 and SW32 are in OFF state. This allows the comparing voltage $V_{CM}$ to the node N1 from the input terminal 102 of the input part 1. At the same time with this, an input impedance of the differential amplifier 3 of the amplification part 2 has an infinite value. As a result, electric charges accumulated during the auto zero period AZ in an electrode of the output side of the coupled capacitance CC1 (i.e., the input side of the differential amplifier 3) are saved.

Hence, during the voltage comparison period CM, the balance voltage $V_{BS}$ is maintained at the second input terminal 22 of the differential amplifier 3, and a potential change at the node N1 ($V_{CM}-V_{IN}$) is transmitted to the first input terminal 21 of the differential amplifier 3 and reversed and amplified by the differential amplifier 3.

That is, an inverse output signal available at the first output terminal 41 of the amplification part 2 has a logic value of "0" when Compare Voltage $V_{CM}$>Compared Voltage $V_{IN}$ and a logic value of "1" when Compare Voltage $V_{CM}$<Compared Voltage $V_{IN}$. The voltage-to-be-compared $V_{IN}$ and the comparing voltage $V_{CM}$ are compared with each other in this manner.

FIG. 9 is a circuitry diagram showing an inner structure of the differential amplifier 3. In FIG. 9, the differential amplifier 3 is comprised of NMOS transistors 51A, 51B, 52A and 52B and PMOS transistors 53A and 53B.

Sources of the NMOS transistors 51A and 51B are commonly grounded, gates of the NMOS transistors 51A and 51B are supplied with the bias voltage VB1 through the bias terminal 71, and drains of the NMOS transistors 51A and 51B are connected to sources of the NMOS transistors 52A and 52B, respectively. A gate of the NMOS transistor 52A is connected to the first input terminal 21, a drain of the NMOS transistor 52A is connected to a drain of the PMOS transistor 53A. A gate of the NMOS transistor 52B is connected to the second input terminal 22 while a drain of the NMOS transistor 52B is connected to a drain of the PMOS transistor 53B. The source of the NMOS transistor 52A and the source of the NMOS transistor 52B are connected to each other.

Gates of the PMOS transistors 53A and 53B receive the bias voltage VB2 through the bias terminal 72. The drain of the NMOS transistor 52A (i.e., the drain of the PMOS transistor 53A) is connected to the first output terminal 41 while the drain of the NMOS transistor 52B (i.e., the drain of the PMOS transistor 53B) is connected to the second output terminal 42. Sources of the PMOS transistors 53A and 53B are each connected to a power source VDD.

Configuration parameters of the transistors 51A, 52A and 53A (i.e., channel width/channel length) are set identical to those of the transistors 51B, 52B and 53B, respectively.

In the differential amplifier 3 of such a construction as above, one of the first and the second output terminals 41 and 42 is set at "1" (VDD level) and the other is set at "0" (ground level) in accordance with a potential difference between the first and the second input terminals 21 and 22.

The differential amplifier cannot operate normally unless a sum of a drain-source current value I51A of the NMOS transistor 51A and a drain-source current value I51B of the NMOS transistor 51B is equal to a sum of a drain-source current value I53A of the PMOS transistor 53A and a drain-source current value I53B of the PMOS transistor 53B.

In other words, a condition (I51A+I51B)=(I53A+I53B) must be satisfied. To this end, where the bias voltage VB1 has a fixed value, the bias voltage VB2 must be set very accurately.

However, during manufacturing, the configuration parameters of the transistors 51A to 53A and the transistors 51B to 53B which form the differential amplifier 3 are not always identical to each other. That is, configuration parameters which were initially desired during designing are not obtained. Due to the differences between configuration parameters, bias potentials at the nodes between the transistors fluctuate. Hence, if the bias voltage VB2 accurately calculated during designing is supplied to the differential amplifier 3, the input/output characteristic of the differential amplifier 3 as an amplifier is deteriorated because of the differences between the configuration parameters of the transistors which form the differential amplifier 3.

A deteriorated input/output characteristic of the differential amplifier 3 is expressed as an input/output characteristic T' of FIG. 8, for example. In FIG. 8, a voltage range RV' is a range in which a gain of the input/output characteristic T' is large and therefore which is suitable for amplification. On the other hand, since the balance voltage $V_{BS'}$ is determined by an intersection M' of the input/output characteristic T' and the line L which satisfies the condition of "Input voltage= Output voltage," the voltage range RV' is deviated from the balance voltage $V_{BS'}$.

When a potential change ($V_{CM}$–$V_{IN}$) at the node N1 of the voltage comparator of FIG. 6 is very small, therefore, the amplitudes of signals which are outputted at the first and the second output terminals 41 and 42 of the amplification part 2 are small due to the very small potential change ($V_{CM}$–$V_{IN}$). Hence, it is impossible to obtain a correct logic output, or if not impossible, it takes a long time to obtain a correct logic output and a high-speed operation becomes impossible.

FIG. 10 is an explanatory diagram showing a structure of a voltage comparator which is designed to solve the problems above. In FIG. 10, a bias circuit 5 is connected to the bias terminals 71 and 72 of the differential amplifier 3. The bias circuit 5 receives one bias voltage VB1, and outputs the bias voltage VB1 and a bias voltage VB3 to the bias terminals 71 and 72, respectively. The circuit structure of FIG. 10 is otherwise similar to that of FIG. 6, and therefore, will not be described further.

FIG. 11 is a circuitry diagram showing an inner structure of the bias circuit 5 of FIG. 10. In FIG. 11, the bias circuit 5 is comprised of NMOS transistors 61 and 62 and a PMOS transistor 63. A source of the NMOS transistor 61 is grounded. A gate of the NMOS transistor 61 receives the bias voltage VB1 and is connected to the bias terminal 71. A drain of the NMOS transistor 61 is connected to a source of the NMOS transistor 62. A drain and a gate of the NMOS transistor 62 are shared by each other. The drain (i.e., gate) of the NMOS transistor 62 is connected to a drain and a gate of the PMOS transistor 63 which are shared by each other. The drain of the NMOS transistor 62 is also connected to the bias terminal 72. A source of the PMOS transistor 63 is connected to the power source VDD. The NMOS transistors 61 and 62 and the PMOS transistor 63 are formed on the same substrate which seats the transistors 51A to 53A and 51B to 53B of the differential amplifier 3.

Now, a configuration parameter of each one of the NMOS transistors 61 and 62 and the PMOS transistor 63 will be described.

The configuration parameters of the NMOS transistors 61 and 62 and the PMOS transistor 63 are set to be the same as those of the NMOS transistors 51A and 52A and the PMOS transistor 53A, respectively, and those of the NMOS transistors 51B and 52B and the PMOS transistor 53B, respectively.

Alternatively, a ratio of the configuration parameters of the NMOS transistors 61 and 62 and the PMOS transistor 63 is set to be the same as a ratio of the configuration parameters of the NMOS transistors 51A and 52A and the PMOS transistor 53A and a ratio of the configuration parameters of the NMOS transistors 51B and 52B and the PMOS transistor 53B.

In addition, as described earlier, since the NMOS transistors 61 and 62 and the PMOS transistor 63 are formed on the same substrate which seats the transistors 51A to 53A and 51B to 53B which form the differential amplifier 3, parameter variations similar to those in the configuration parameters of the transistors 51A to 53A and 51B to 53B of the differential amplifier 3 are created in the configuration parameters of the transistors 61 to 63 of the bias circuit 5.

Since source-drain paths of the NMOS transistors 61 and 62 and the PMOS transistor 63 of the bias circuit 5 are connected to the same path, a source-drain current value I61 of the NMOS transistor 61 is equal to a source-drain current value I63 of the PMOS transistor 63.

Such a bias circuit 5 is connected to the differential amplifier 3 through the bias terminals 71 and 72. Because of the connection of the differential amplifier 3 to the bias circuit 5 through the bias terminal 72, a current mirror circuit is formed by the PMOS transistor 63 of the bias circuit 5 and the PMOS transistors 53A and 53B of the differential amplifier 3.

Hence, by applying the bias voltage VB1 under this condition, the bias circuit 5 applies the bias voltage VB1 directly to the gates of the NMOS transistors 51A and 51B of the differential amplifier 3, and the bias voltage VB3 which causes I61=I63 is outputted at the bias terminal 72.

That is, the bias voltage VB3 is controlled to a value which corrects the variations in the configuration parameters of the transistors 61 to 63 of the bias circuit 5 to thereby cause I61=I63. The variations in the configuration parameters of the transistors 61 to 63 reflect the variations in the configuration parameters of the transistors 51A to 53A and 51B to 53B of the differential amplifier 3.

Therefore, with the bias voltage VB3 supplied to the gates of the PMOS transistors 53A and 53B of the differential amplifier 3 through the bias terminal 72, the variations regarding the transistors 51A to 53A and 51B to 53B of the differential amplifier 3 are corrected. As a result, an excellent input/output characteristic is realized.

However, there arises a new problem in that the power source voltage must be increased to use the bias circuit 5. This new problem will be described in detail in the following.

A minimum necessary power source voltage in the bias circuit 5 must be equal to or larger than (drain-source voltage Vdsat1 for maintaining the NMOS transistor 61 saturated)+(drain-source voltage Vdsat2 for maintaining the NMOS transistor 62 saturated)+(drain-source voltage Vdsat3 for maintaining the PMOS transistor 63 saturated)+(threshold voltage Vth2 of the NMOS transistor 62)+(threshold voltage Vth3 of the PMOS transistor 63).

Meanwhile, a power source voltage necessary for the differential amplifier 3 alone must be equal to or larger than (drain-source voltage Vdsat1 for maintaining the NMOS transistor 51A (51B) saturated)+(drain-source voltage Vdsat2 for maintaining the NMOS transistor 52A (52B) saturated)+(drain-source voltage Vdsat3 for maintaining the PMOS transistor 53A (53B) saturated)+(threshold voltage Vth2 of the NMOS transistor 52A (52B)).

In short, due to provision of the bias circuit 5, the power source voltage necessary for the differential amplifier 3 must be additionally increased by (threshold voltage Vth3 of the PMOS transistor 63), which directly counters the effort to suppress the power source voltage. Considering a general need of 3 V as a power source voltage for electronic equipment for driving a battery, an increased threshold voltage (of about 0.7 V) is a fatal disadvantage.

SUMMARY OF THE INVENTION

In a first aspect of the present invention, a differential amplifier circuit comprises: a first differential amplifier including first and second input pans, first and second output parts and a bias terminal, the first differential amplifier amplifying a potential difference between the first and the second input parts and outputting a resultant signal from the first output part and an inversed signal of the resultant signal from the second output part, an input/output characteristic of the first differential amplifier being controlled by a voltage which appears at the bias terminal; and a bias circuit which is connected to the bias terminal to output a bias voltage to the bias terminal. The bias circuit includes a second differential amplifier which is formed on the same substrate which seats the first differential amplifier, the second differential amplifier including third and fourth input parts and third and fourth output pans, the second differential amplifier amplifying a potential difference between the third and the fourth input parts and outputting a resultant signal from the third output part and an inversed signal of the resultant signal from the fourth output part, the third input part and the third output part being shorted to each other, the second differential amplifier receiving a predetermined input voltage at the fourth input part and outputting a voltage which appears at the fourth output part to the bias terminal as the bias voltage.

According to a second aspect of the present invention, in the differential amplifier circuit of the first aspect of the present invention, the first differential amplifier includes: a first load current control transistor having one electrode which is connected to a first power source, another electrode which serves as the first output part and a control electrode which receives a control voltage, the first load current control transistor supplying a first load current from the first power source to the first output part in accordance with the control voltage; a second load current control transistor having one electrode which is connected to the first power source, another electrode which serves as the second output part and a control electrode which receives a control voltage, the second load current control transistor supplying a second load current from the first power source to the second output part in accordance with the control voltage; a first output control transistor having one electrode which is connected to the first output part and a control electrode which serves as the first input part; a second output control transistor having one electrode which is connected to the second output part and a control electrode which serves as the second input part; and first constant current supply means having one terminal which is connected to the other electrodes of the first and the second output control transistors and another terminal which is connected to a second power source, the first constant current supply means supplying a constant current to the second power source. The control electrodes of the first and the second load current control transistors are commonly connected to the bias terminal The second differential amplifier of the bias circuit includes: a voltage input terminal for receiving the predetermined input voltage; a third load current control transistor having one electrode which is connected to the first power source, another electrode which serves as the third output part and a control electrode which receives a control voltage, the third load current control transistor supplying a third load current from the first power source to the third output part in accordance with the control voltage; a fourth load current control transistor having one electrode which is connected to the first power source, another electrode which serves as the fourth output part and a control electrode which receives a control voltage, the fourth load current control transistor supplying a fourth load current from the first power source to the fourth output part in accordance with the control voltage; a third output control transistor having one electrode which is connected to the third output part and a control electrode which serves as the third input part; a fourth output control transistor having one electrode which is connected to the fourth output part and a control electrode which serves as the fourth input part; and second constant current supply means having one terminal which is connected to the other electrodes of the third and the fourth output control transistors and other terminal which is connected to the second power source, the second constant current supply means supplying a constant current to the second power source. The control electrode and the one electrode of the third output control transistor are shorted to each other, the control electrode and the other electrode of the fourth load current control transistor are shorted to each other, the control electrode of the fourth output control transistor is connected to the voltage input terminal, and voltages which appear at the control electrodes of the third and the fourth load current control transistors are outputted to the bias terminal as the bias voltage.

Preferably, in the first differential amplifier, configuration parameters of the first and the second load current control transistors are set to be identical to each other and configuration parameters of the first and the second output control transistors are set to be identical to each other, and in the second differential amplifier, configuration parameters of the third and the fourth load current control transistors are set to be identical to each other and configuration parameters of the third and the fourth output control transistors are set to be identical to each other.

Further preferably, the configuration parameters of the third and the fourth load current control transistors and the third and the fourth output control transistors are set to be identical to the configuration parameters of the first and the second load current control transistors and the first and the second output control transistors, respectively.

Alternatively, a ratio of the configuration parameters of the third and the fourth load current control transistors and the third and the fourth output control transistors is set to be identical to a ratio of the configuration parameters of the first and the second load current control transistors and the first and the second output control transistors.

The first power source, preferably, supplies a higher voltage than the second power source, the first to the fourth load current control transistors are PMOS transistors, and the first to the fourth output control transistors are NMOS transistors.

According to a third aspect of the present invention, in the differential amplifier circuit of the first aspect of the present invention, the first constant current supply means of the first differential amplifier includes: a second bias terminal for receiving a current control voltage; a first constant current control transistor having one electrode which is connected to the other electrodes of the first and the second output control transistors as the one terminal, another electrode which is connected to the second power source as the other terminal and a control electrode which receives the current control voltage through the second bias terminal, the first constant current control transistor supplying a first constant current to the second power source in accordance with the current control voltage; and a second constant current control transistor having one electrode which is connected to the other electrodes of the first and the second output control transistors as the one terminal, another electrode which is connected to the second power source as the other terminal and a control electrode which receives the current control voltage through the second bias terminal, the second constant current control transistor supplying a second constant current to the second power source in accordance with the current control voltage. The second constant current supply means of the second differential amplifier of the bias circuit includes: a third bias terminal for receiving the current control voltage; a third constant current control transistor having one electrode which is connected to the other electrodes of the third and the fourth output control transistors as the one terminal, another electrode which is connected to the second power source as the other terminal and a control electrode which receives the current control voltage through the third bias terminal, the third constant current control transistor supplying a third constant current to the second power source in accordance with the current control voltage; and a fourth constant current control transistor having one electrode which is connected to the other electrodes of the third and the fourth output control transistors as the one terminal, another electrode which is connected to the second power source as the other terminal and a control electrode which receives the current control voltage through the third bias terminal, the fourth constant current control transistor supplying a fourth constant current to the second power source in accordance with the current control voltage.

In the first differential amplifier of the third aspect of the present invention, configuration parameters of the first and the second load current control transistors may be set to be identical to each other, configuration parameters of the first and the second output control transistors are set to be identical to each other, and configuration parameters of the first and the second constant current control transistors are set to be identical to each other. In the second differential amplifier, configuration parameters of the third and the fourth load current control transistors may be set to be identical to each other, configuration parameters of the third and the fourth output control transistors are set to be identical to each other, and configuration parameters of the third and the fourth constant current control transistors are set to be identical to each other.

Further, the configuration parameters of the third and the fourth load current control transistors, the third and the fourth output control transistors and the third and the fourth constant current control transistors are preferably set to be identical to the configuration parameters of the first and the second load current control transistors, the first and the second output control transistors and the first and the second constant current control transistors, respectively.

Alternatively, a ratio of the configuration parameters of the third and the fourth load current control transistors, the third and the fourth output control transistors and the third and the fourth constant current control transistors may be set to be identical to a ratio of the configuration parameters of the first and the second load current control transistors, the first and the second output control transistors and the first and the second constant current control transistors.

The first power source preferably supplies a higher voltage than the second power source, the first to the fourth load current control transistors are PMOS transistors, the first to the fourth output control transistors are NMOS transistors, and the first to the fourth constant current control transistors are NMOS transistors.

According to a fourth aspect of the present invention, in the differential amplifier circuit of the third aspect of the present invention, the first constant current supply means of the first differential amplifier includes: a second bias terminal for receiving a current control voltage; and a first constant current control transistor having one electrode which is connected to the other electrodes of the first and the second output control transistors as the one terminal, another electrode which is connected to the second power source as the other terminal and a control electrode which receives the current control voltage through the second bias terminal, the first constant current control transistor supplying a constant current to the second power source in accordance with the current control voltage. The second constant current supply means of the second differential amplifier of the bias circuit includes: a third bias terminal for receiving the current control voltage; and a third constant current control transistor having one electrode which is connected to the other electrodes of the third and the fourth output control transistors as the one terminal, another electrode which is connected to the second power source as the other terminal and a control electrode which receives the current control voltage through the third bias terminal, the third constant current control transistor supplying a constant current to the second power source in accordance with the current control voltage.

Preferably, in the first differential amplifier, configuration parameters of the first and the second load current control transistors are set to be identical to each other and configuration parameters of the first and the second output control transistors are set to be identical to each other, and in the second differential amplifier, configuration parameters of the third and the fourth load current control transistors are set to be identical to each other and configuration parameters of the third and the fourth output control transistors are set to be identical to each other.

Further, the first power source preferably supplies a higher voltage than the second power source, the first to the fourth load current control transistors are PMOS transistors, the first to the fourth output control transistors are NMOS transistors, and the constant current control transistor is an NMOS transistor.

The present invention is also related to a voltage comparator which comprises: a voltage-to-be-compared input terminal for receiving a voltage-to-be-compared; a comparing voltage input terminal for receiving a comparing voltage; a differential amplifier circuit including first and second input terminals and first and second output terminals; a first capacitor having one electrode which is connected to the first input terminal of the differential amplifier circuit; a second capacitor having one electrode which is connected to the second input terminal of the differential amplifier circuit and another electrode which is grounded; first switching means which is inserted between the voltage-to-be-compared input terminal and the first capacitor, the first switching means turning on and off in response to a first control signal; second switching means which is inserted between the comparing voltage input terminal and the first capacitor, the second switching means turning on and off in response to a second control signal; third switching means which is inserted between the first output terminal and the first output terminal of the differential amplifier circuit, the third switching means turning on and off in response to the first control signal; and fourth switching means which is inserted between the second output terminal and the second output terminal of the differential amplifier circuit, the fourth switching means turning on and off in response to the first control signal. The differential amplifier circuit includes a first differential amplifier which has a first and a second input parts, first and second output parts and a bias terminal, the first differential amplifier amplifying a potential difference between the first and the second input parts and outputting a resultant signal from the first output part and an inverse signal of the resultant signal from the second output part, an input/output characteristic of the first differential amplifier being controlled by a voltage which appears at the bias terminal, the first and the second input pans being connected to the first and the second input terminals, respectively, and the first and the second output parts being connected to the first and the second output terminals, respectively. The differential amplifier circuit further includes a bias circuit which is connected to the bias terminal to output a bias voltage to the bias terminal. The bias circuit includes a second differential amplifier which is formed on the same substrate which seats the first differential amplifier, the second differential amplifier having third and fourth input parts and third and fourth output parts, the second differential amplifier amplifying a potential difference between the third and the fourth input parts and outputting a resultant signal from the third output part and an inverse signal of the resultant signal from the fourth output part, the third input part and the third output part being shorted to each other, the second differential amplifier receiving a predetermined input voltage at the fourth input part and outputting a voltage which appears at the fourth output part to the bias terminal as the bias voltage.

As heretofore described, in the first aspect of the present invention, the second differential amplifier of the bias circuit, which is formed on the same substrate which seats the first differential amplifier, has the third and the fourth input parts and the third and the fourth output parts. The second differential amplifier amplifies a potential difference between the third and the fourth input parts and outputs a resultant signal from the third output part and an inverse signal of the signal from the fourth output part. The third input part and the third output part are shorted to each other. The second differential amplifier receives a predetermined input voltage at the fourth input part and outputs a voltage which appears at the fourth output part to the bias terminal as the bias voltage. Hence, this bias voltage has a value which is optimum for the second differential amplifier to perform differential amplification.

In addition, since the first and the second differential amplifiers are formed on the same substrate, variations in the configuration of the elements during manufacturing are similar between the first and the second differential amplifiers.

As a result, since the bias voltage is impressed on the control electrodes of the first and the second load current control transistors of the first differential amplifier, in the first differential amplifier as well, variations in the configuration of the transistors are corrected to be optimum for differential amplification. Hence, the first differential amplifier has an excellent input/output characteristic.

On the other hand, since the second differential amplifier is equivalent in structure to the first differential amplifier, an operating voltage of the second differential amplifier becomes equal to an operating voltage of the first differential amplifier.

This makes it possible to suppress an operating power source voltage to a minimum necessary level.

In the differential amplifier circuit of the second aspect of the present invention, the bias circuit includes the second differential amplifier which is equivalent in structure to the first differential amplifier. The control electrode (i.e., the third input part) and the one electrode (i.e., the third output part) of the third output control transistor are short-circuited to each other. The control electrode and the other electrode (i.e., the fourth output part) of the fourth output control transistor are also short-circuited to each other. Hence, a potential at the control electrode of the third output control transistor is controlled to be equal to an output control voltage which is applied to the control electrode of the fourth output control transistor.

Therefore, in the second differential amplifier, third and fourth load currents of the third and the fourth load current control transistors correct variations in the configuration of the transistors of the second differential amplifier into values which are optimum for the second differential amplifier to perform differential amplification.

Voltages which appear at the control electrodes the third and the fourth load current control transistors are outputted at the bias terminal as the bias voltage and applied to the control electrodes of the first and the second load current control transistors of the first differential amplifier.

Further, since the first and the second differential amplifiers are formed on the same substrate, variations in the configuration of the elements during manufacturing are similar between the first and the second differential amplifiers.

As a result, since the bias voltage is impressed on the control electrodes of the first and the second load current control transistors of the first differential amplifier, in the first differential amplifier as well, variations in the configu-

11 ration of the transistors are corrected into the first and the second load currents which are optimum for differential amplification. Hence, the first differential amplifier has an excellent input/output characteristic.

On the other hand, since the second differential amplifier is equivalent in structure to the first differential amplifier, a potential difference between the first and the second power sources with which the second differential amplifier can operate becomes equal to a potential difference between the first and the second power sources with which the first differential amplifier can operate.

This makes it possible to suppress an operating power source voltage to a minimum necessary level.

Still further, since an output control voltage applied to the control electrode of the fourth output control transistor of the second differential amplifier of the bias circuit determines a balance voltage of the first differential amplifier, it is easy to externally set a balance voltage of the first differential amplifier.

In the differential amplifier circuit of the third aspect of the present invention, the second constant current supply means of the second differential amplifier of the bias circuit is formed by the third and the fourth constant current control transistors as the first constant current supply means of the first differential amplifier which is formed by the first and the second constant current control transistors. Hence, the first and the second differential amplifiers are equivalent to each other including the structure of the constant current supply means.

In the differential amplifier circuit of the fourth aspect of the present invention, the second constant current supply means of the second differential amplifier of the bias circuit is formed by the second constant current control transistor as the first constant current supply means of the first differential amplifier which is formed by the first constant current control transistor. Hence, the first and the second differential amplifiers are equivalent to each other including the structure of the constant current supply means.

Accordingly, it is an object of the present invention to offer a differential amplifier circuit which suppresses an operating power source voltage to a minimum necessary level and which has an excellent input/output characteristic.

These and other objects, features, aspects and advantages of the present invention will become more apparent from the following detailed description of the present invention when taken in conjunction with the accompanying drawings.

12

Figure 6:
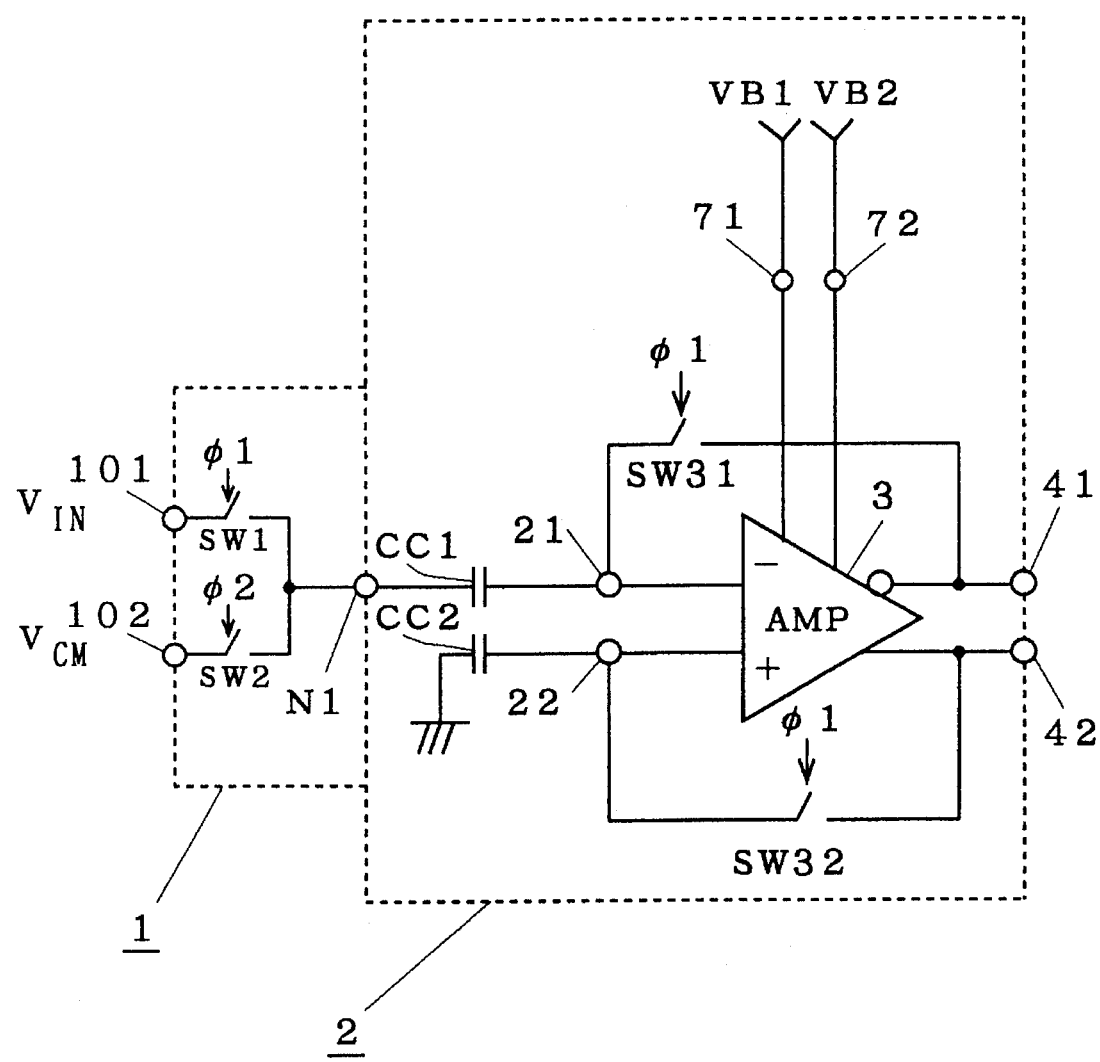
Figure 7:
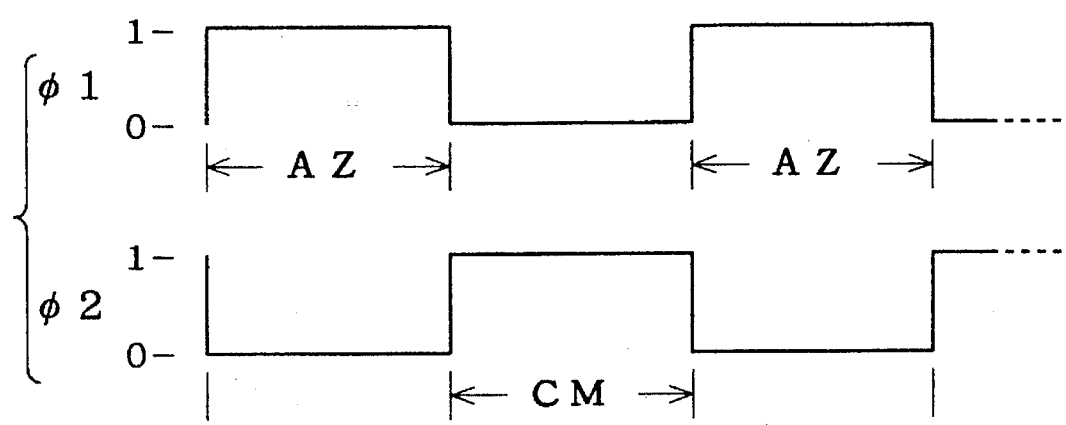
Figure 8:
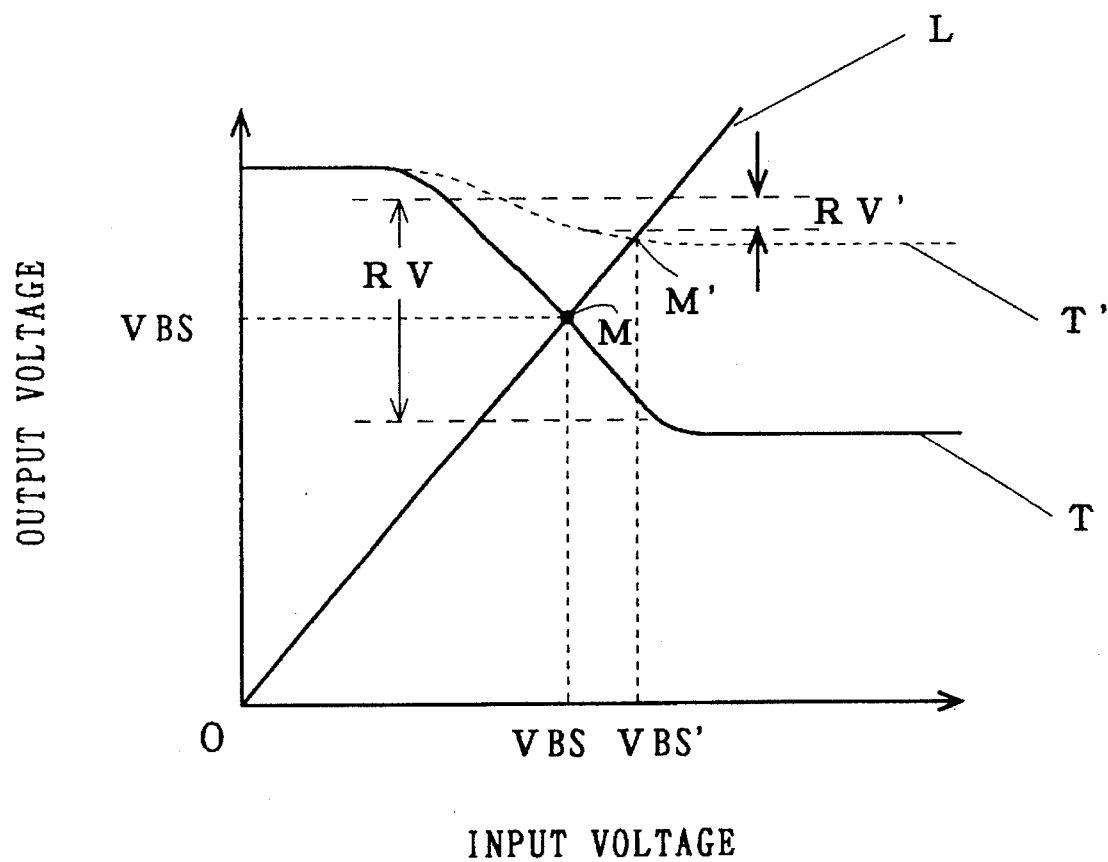
Figure 9:
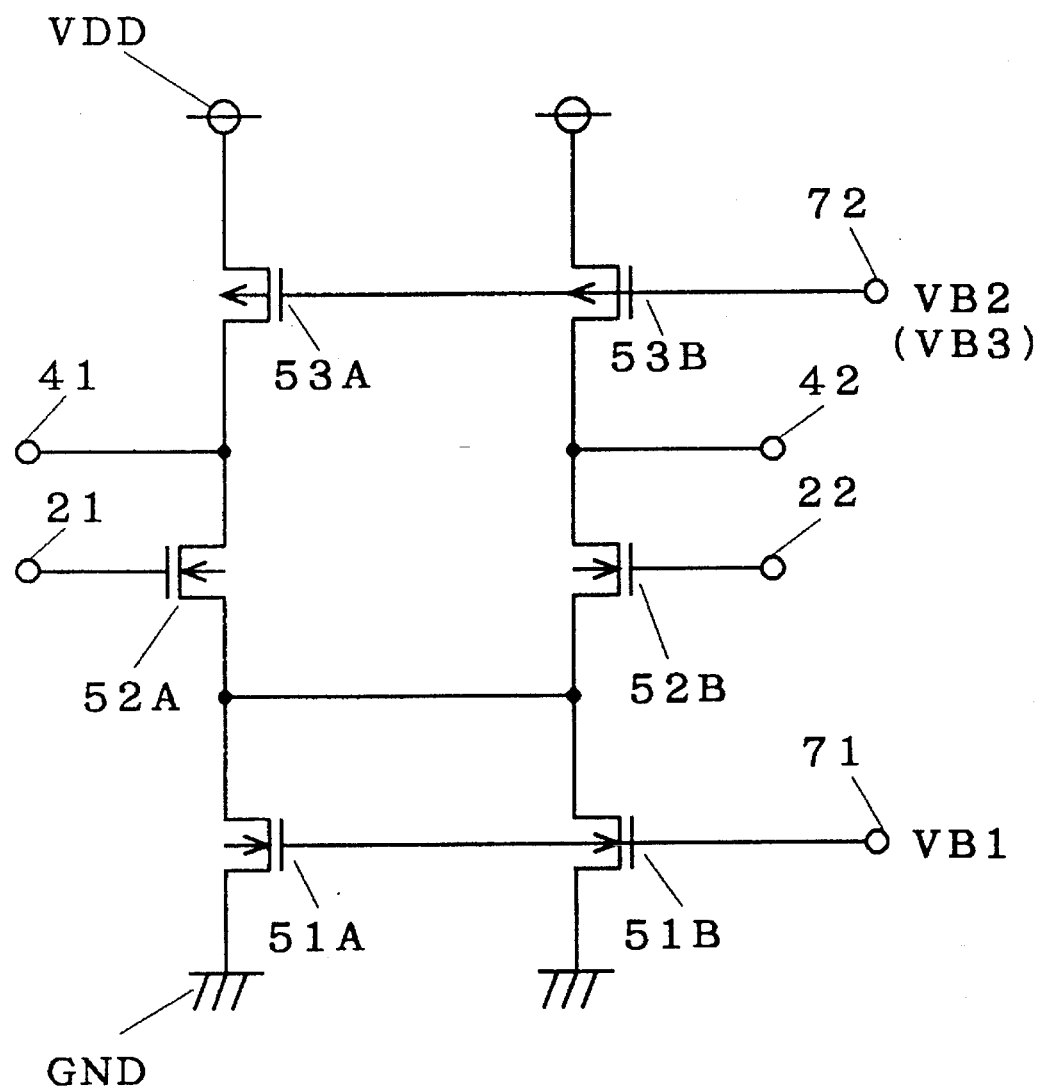
Figure 10:
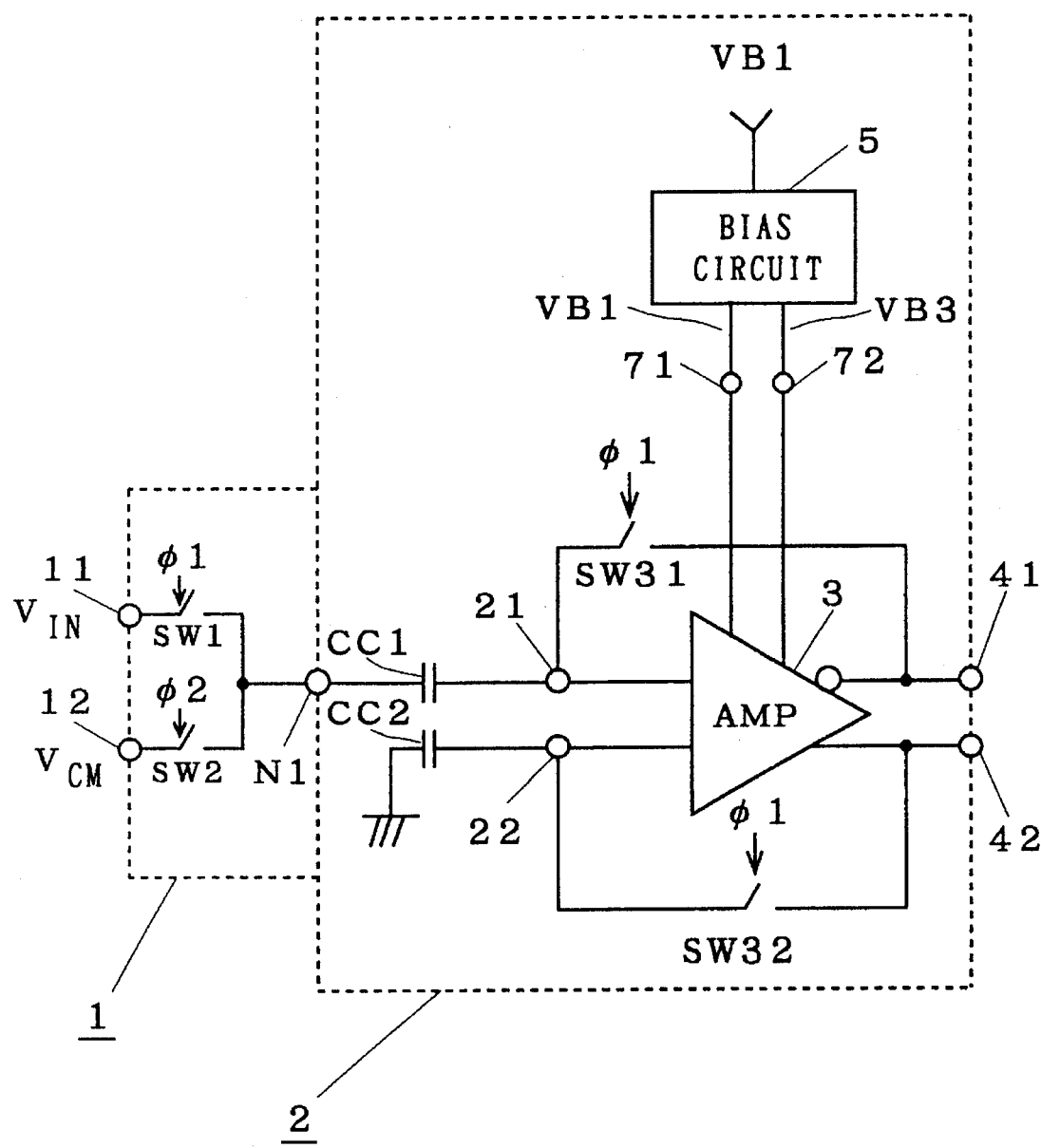
Figure 11:
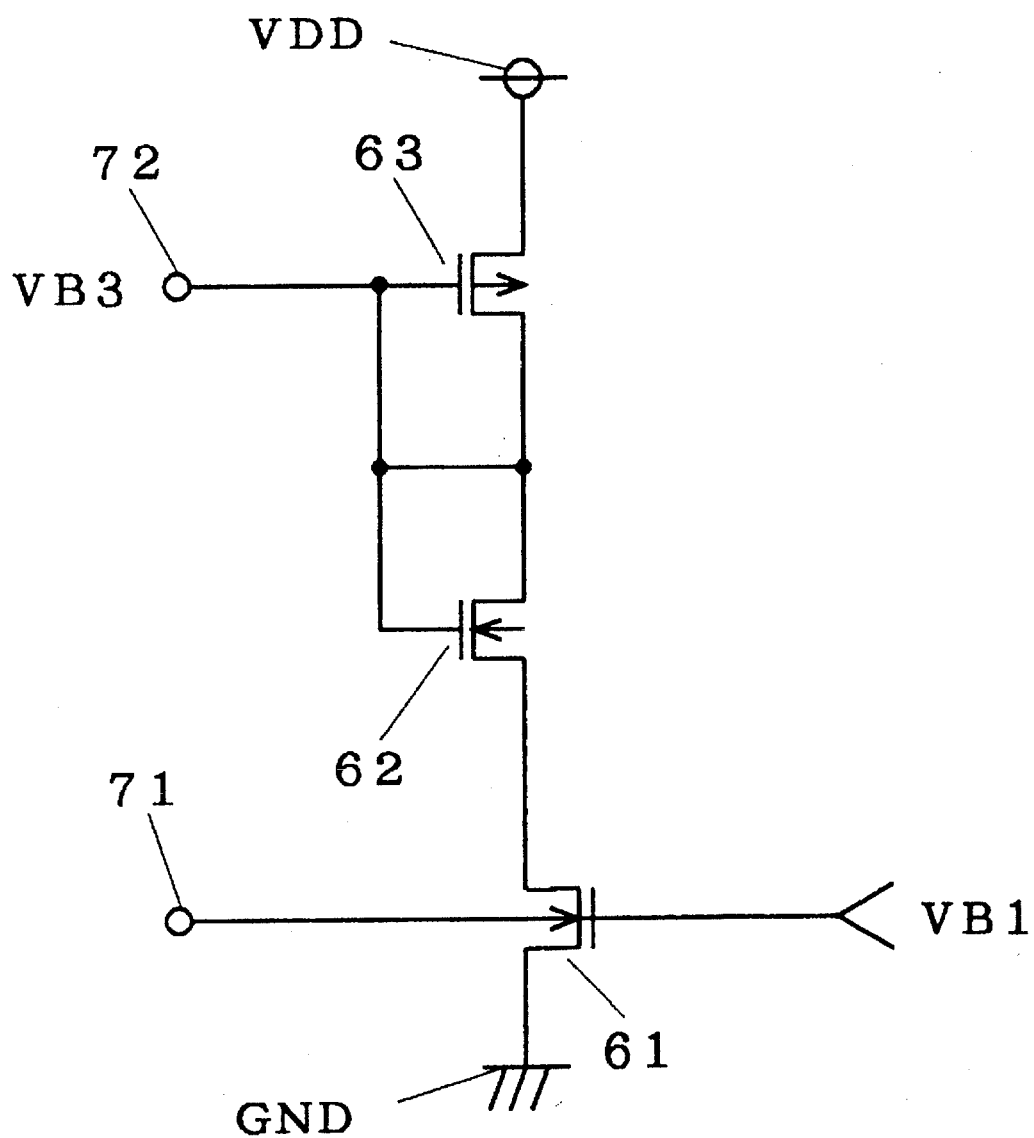

FIG. 6 is a circuitry diagram showing a structure of a conventional voltage comparator;

FIG. 7 is a timing chart for explaining an operation of the conventional voltage comparator;

FIG. 8 is a waveform diagram showing an input/output characteristic of a differential amplifier;

FIG. 9 is a circuitry diagram showing an inner structure of the conventional voltage comparator;

FIG. 10 is a circuitry diagram showing a structure of the conventional voltage comparator which includes a differential amplifier circuit which contains a bias circuit; and FIG. 11 is a circuitry diagram showing an inner structure of the bias circuit of FIG. 10.

DESCRIPTION OF THE PREFERRED EMBODIMENTS

<First Preferred Embodiment>

Figure 1:
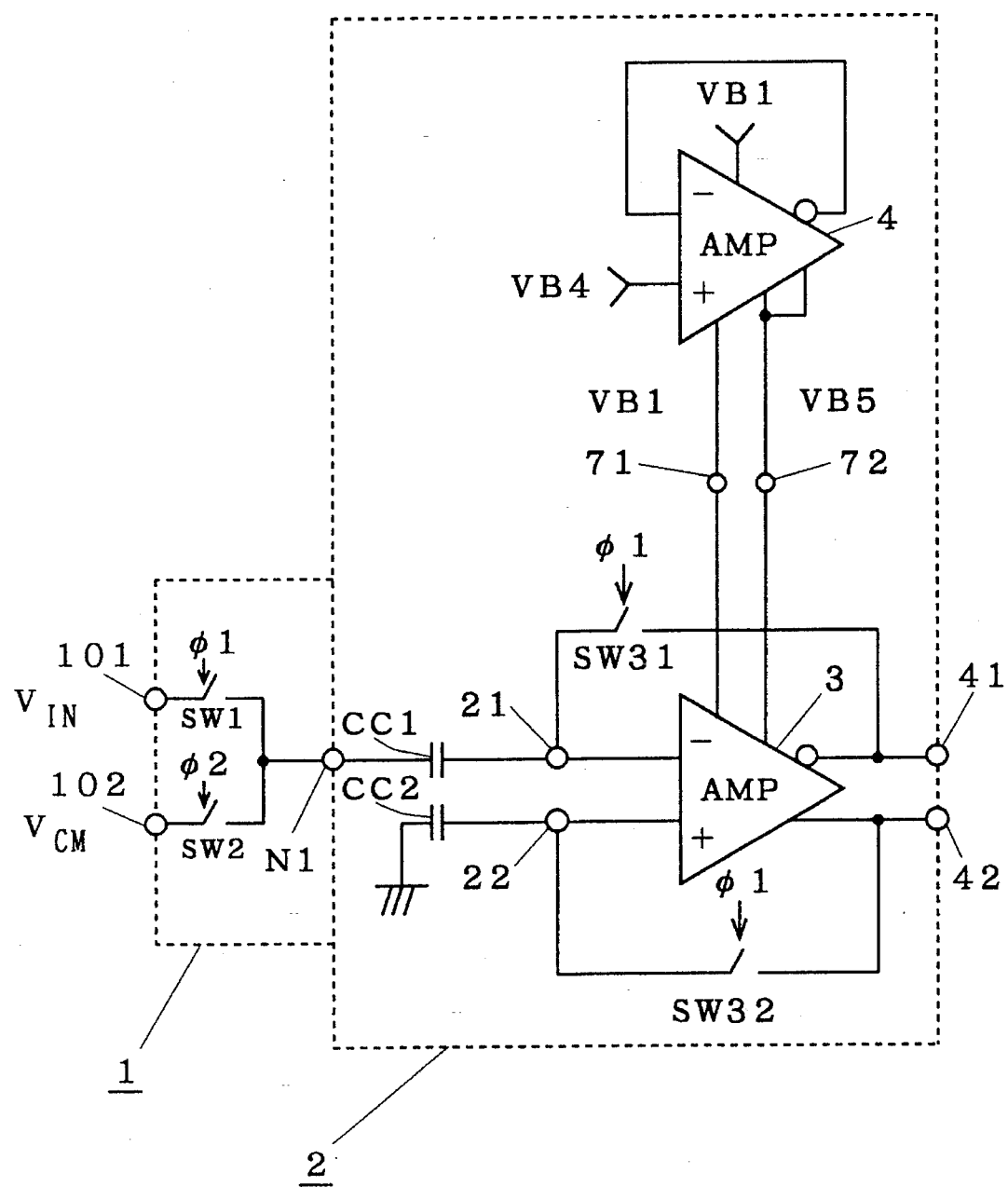
FIG. 1 is a circuitry diagram of a voltage comparator which uses a differential amplifier circuit according to a first preferred embodiment of the present invention.

FIG. 1 is a circuitry diagram showing a structure of a voltage comparator which uses a differential amplifier circuit according to a first preferred embodiment of the present invention. As shown in FIG. 1, the voltage comparator is comprised of an input part 1 and an amplification part 2 which is the differential amplifier circuit of the first preferred embodiment.

The input part 1 includes an input terminal 101 and an input terminal 102 for receiving a voltage-to-be-compared $V_{IN}$ and a comparing voltage $V_{CM}$, respectively, from outside. The input terminal 101 is connected to a node N1 which serves as an output terminal through a switch SW1 while the input terminal 102 is connected to the node N1 through a switch SW2. The switch SW1 turns on and off under the control of a control signal $\phi1$. The switch SW2 turns on and off under the control of a control signal $\phi2$.

An input terminal of the amplification part 2 is the node N1. The amplification part 2 is connected from this node N1 to a first input terminal 21 of the differential amplifier 3 through a coupled capacitance CC1. A second input terminal 22 of the differential amplifier 3 is grounded through a coupled capacitance CC2.

A negative input to the differential amplifier 3 is coupled to the first input terminal 21. An inverse output generated from the negative input is outputted to outside at a first output terminal 41 and returned to the first input terminal 21 through a switch SW31. A positive input to the differential amplifier 3 is coupled to the second input terminal 22. A non-inverting output generated from the positive input is outputted to outside at a second output terminal 42 and returned to the second input terminal 22 through a switch SW32.

To the differential amplifier 3, bias voltages VB1 and VB5 are supplied through bias terminals 71 and 72, respectively, from a bias circuit 4.

Basically, the bias circuit 4 is a differential amplifier which returns an inverse output to its negative input, receives the first bias voltage VB1 at its bias terminal (not shown) and a second bias voltage VB4 at its positive input. The bias circuit 4 outputs the bias voltage VB1 to the bias terminal 71 and the bias voltage VB5, which is the voltage of the non-inverting output, to the bias terminal 72.

Figure 2:
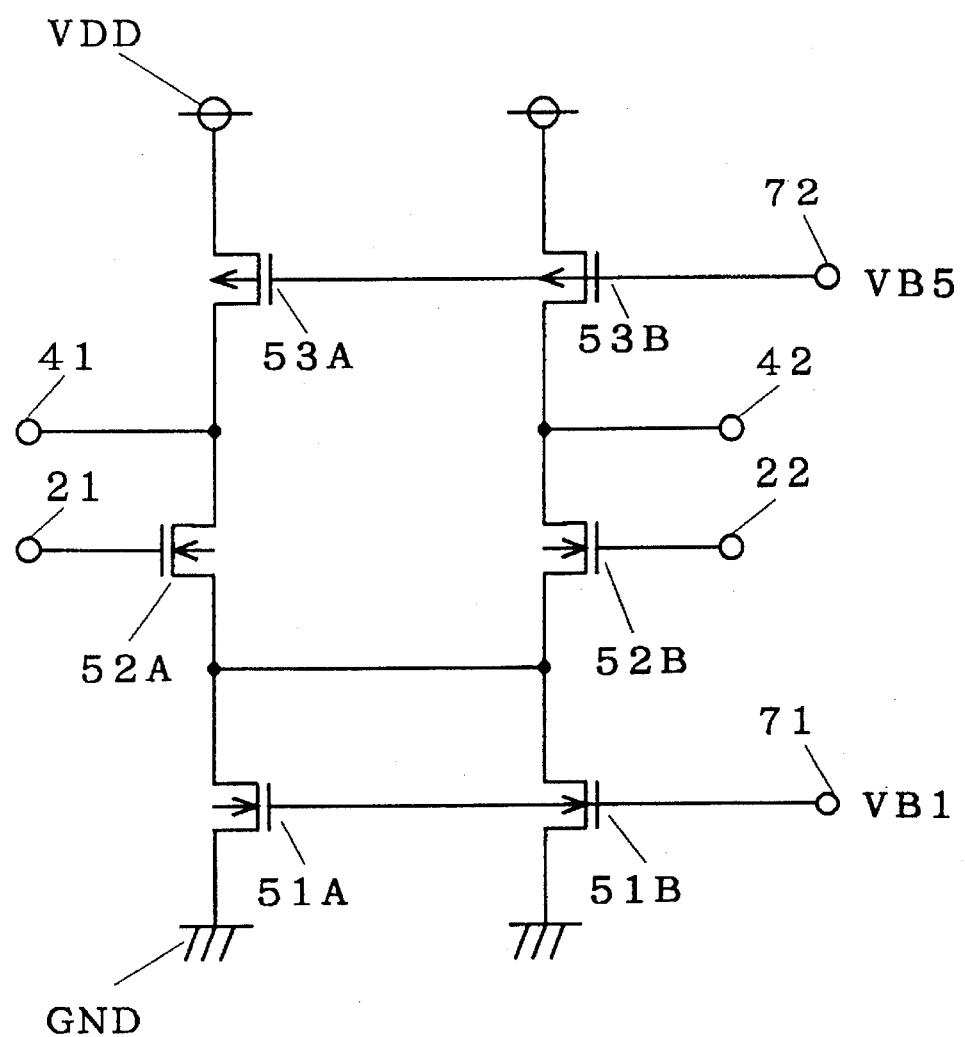
FIG. 2 is a circuitry diagram showing an inner structure of the differential amplifier of FIG. 1.

FIG. 2 is a circuitry diagram showing an inner structure of the differential amplifier 3. As can be seen in FIG. 2, the differential amplifier 3 is formed by NMOS transistors 51A, 51B, 52A and 52B and PMOS transistors 53A and 53B.

Sources of the NMOS transistors 51A and 51B which are constant current control transistors are commonly grounded.

Gates of the NMOS transistors 51A and 51B are supplied with the bias voltage VB1 through the bias terminal 71. Drains of the NMOS transistors 51A and 51B are connected to sources of the NMOS transistors 52A and 52B, respectively, and are also connected to each other.

A gate of the NMOS transistor 52A is connected to the first input terminal 21, a drain of the NMOS transistor 52A is connected to a drain of the transistor 53A which is a PMOS load current control transistor. A gate of the NMOS transistor 52B is connected to the second input terminal 22 while a drain of the NMOS transistor 52B is connected to a drain of the PMOS transistor 53B which is formed as a load current control transistor.

The bias voltage VB5 is applied to gates of the PMOS transistors 53A and 53B through the bias terminal 72. The drain of the NMOS transistor 52A (i.e., the drain of the PMOS transistor 53A) is connected to the first output terminal 41 while the drain of the NMOS transistor 52B (i.e., the PMOS transistor 53B) is connected to the second output terminal 42. Sources of the PMOS transistors 53A and 53B are each connected to a power source VDD.

Configuration parameters of the transistors 51A, 52A and 53A (i.e., channel width/channel length) are set to be identical to those of the transistors 51B, 52B and 53B, respectively.

Figure 3:
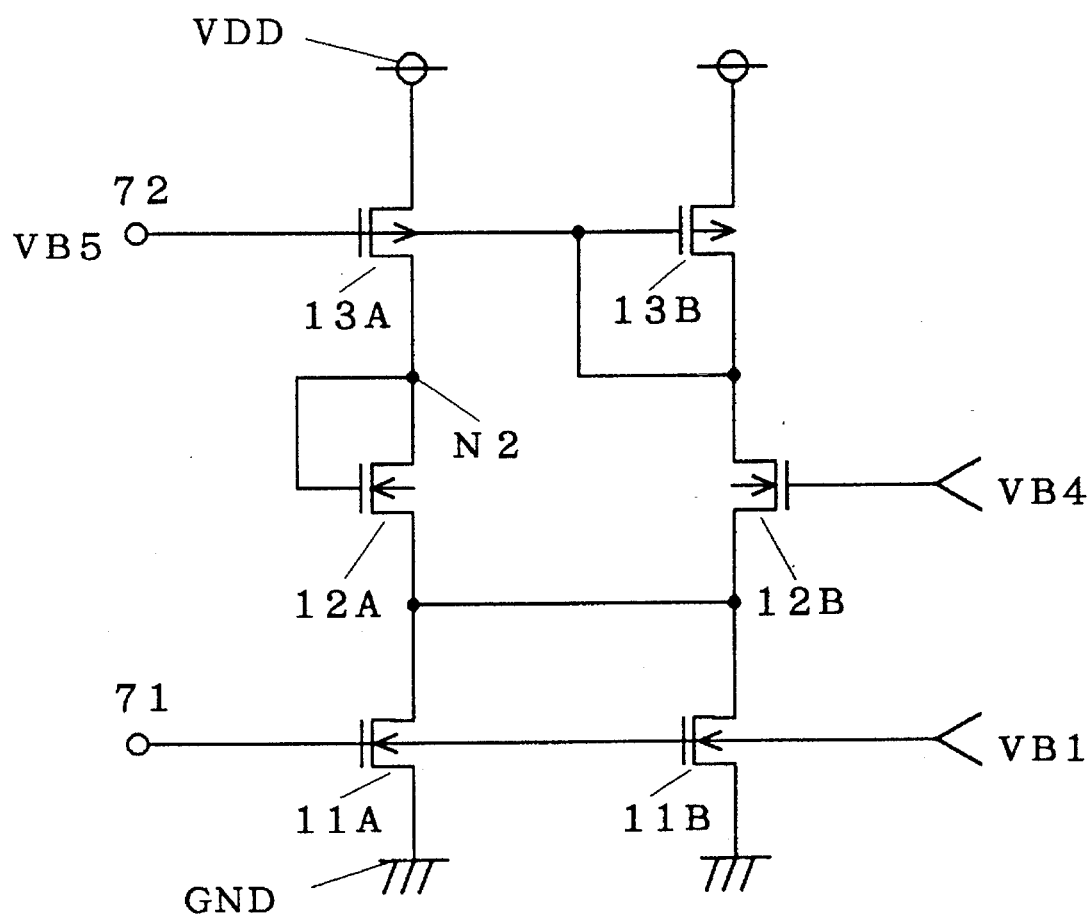
FIG. 3 is a circuitry diagram showing an inner structure of the bias circuit of FIG. 1.

FIG. 3 is a circuitry diagram showing an inner structure of the bias circuit 4. In FIG. 3, the bias circuit 4 is formed by NMOS transistors 11A, 11B, 12A and 12B and PMOS transistors 13A and 13B.

Sources of the NMOS transistors 11A and 11B, or constant current control transistors, are commonly grounded. Gates of the NMOS transistors 11A and 11B for receiving the bias voltage VB1 are connected to the bias terminal 71. Drains of the NMOS transistors 11A and 11B are connected to sources of the NMOS transistors 12A and 12B which are structured as output control transistors, and are also connected to each other. Hence, the NMOS transistors 11A and 11B, or constant current control transistors of the bias circuit 4, are equivalent in terms of structure to the NMOS transistors 51A and 51B which are formed as constant current control transistors of the differential amplifier 3.

A gate and a drain of the NMOS transistor 12A are short-circuited to each other. The drain (gate) of the NMOS transistor 12A is connected to a drain of the PMOS transistor 13A which is a load current control transistor. On the other hand, the bias voltage VB4 is impressed on a gate of the NMOS transistor 12B. A drain of the NMOS transistor 12B is connected to a drain (gate) of the PMOS transistor 13B which is a load current control transistor having its gate and drain shorted to each other.

Gates of the PMOS transistors 13A and 13B are connected to the bias terminal 72 and sources of the PMOS transistors 13A and 13B are both connected to the power source VDD. Hence, gate voltages of the PMOS transistors 13A and 13B are supplied to the bias terminal 72 as the bias voltage VB5.

Configuration parameters of the transistors 11A, 12A and 13A (i.e., channel width/channel length) are designed to be identical to those of the transistors 11B, 12B and 13B, respectively.

Now, a description will be given on configuration parameters of the respective transistors of the differential amplifier 3 with respect to the NMOS transistor 11 (11A, 11B), the NMOS transistor 12 (12A, 12B) and the PMOS transistor 13 (13A, 13B).

The configuration parameters of the NMOS transistors 11 and 12 and the PMOS transistor 13 are set to be the same as those of the NMOS transistors 51A and 52A and the PMOS transistor 53A, respectively, and those of the NMOS transistors 51B and 52B and the PMOS transistor 53B, respectively.

Alternatively, a ratio of the configuration parameters of the NMOS transistors 11 and 12 and the PMOS transistor 13 is set to be the same as a ratio of the configuration parameters of the NMOS transistors 51A and 52A and the PMOS transistor 53A, and a ratio of the configuration parameters of the NMOS transistors 51B and 52B and the PMOS transistor 53B.

Thus, including the constant current control transistors, the bias circuit 4 is constructed basically as a voltage follower circuit which is capable of operating as a second differential amplifier which is equivalent to the differential amplifier 3. In the bias circuit 4, the gate and the drain of the NMOS transistor 12A are short-circuited to each other and the gate and the drain of the PMOS transistor 13B are short-circuited to each other so that a gate potential at the NMOS transistor 12A is equal to the bias voltage VB4 which is applied to the gate of the NMOS transistor 12B.

In the following, this point will be described in detail.

When the gate potential at the NMOS transistor 12A is exceeded by the bias voltage VB4 for a short period of time, a drain current of the NMOS transistor 12B tends to exceed the drain current at the NMOS transistor 12A.

Meanwhile, a drain current of the PMOS transistor 13B is equal to the drain current of the NMOS transistor 12B, and the PMOS transistor 13A and the PMOS transistor 13B form a current mirror structure. Hence, a drain current of the PMOS transistor 13A becomes equal to the drain current of the NMOS transistor 12B.

As a result, the drain current of the PMOS transistor 13A exceeds the drain current of the NMOS transistor 12A. This causes a potential at a node N2 which is an intersection of the drain (gate) of the NMOS transistor 12A and the drain of the PMOS transistor 13A, that is, the gate potential at the NMOS transistor 12A to increase.

On the other hand, when the gate potential at the NMOS transistor 12A exceeds the bias voltage VB4 for a short period of time, the drain current of the NMOS transistor 12B tends to become smaller than the drain current of the NMOS transistor 12A.

Since the drain current of the PMOS transistor 13A consequently becomes smaller than the drain current of the NMOS transistor 12A, the gate potential at the NMOS transistor 12A falls.

In other words, assuming that the gate potential at the NMOS transistor 12A is V12, V12 increases when V12<VB4 and decreases when V12>VB4. Hence, the bias circuit 4 controls so that V12=VB4 holds.

If such a bias circuit 4 is connected to the differential amplifier 3 through the bias terminals 71 and 72, the bias voltage VB4 becomes the balance voltage $V_{BS}$ of the differential amplifier 3. Thus, the balance voltage $V_{BS}$ of the differential amplifier 3 can be easily adjusted in accordance with the bias voltage VB4.

Further, since the gate potential at the NMOS transistor 12A of the bias circuit 4 is controlled to be equal to the bias voltage VB4 which is supplied to the gate of the NMOS transistor 12B, the drain-source currents between the transistors 11A, 12A and 13A become equal to the drain-source currents between the transistors 11B, 12B and 13B. As a result, a current value I11B (I11A) between the source and the drain of the NMOS transistor 11B (11A) becomes equal to a current value I13B (I13A) between the source and the drain of the PMOS transistor 13B (13A). This situation is always realized by changing the bias voltage VB5, or the gate voltages of the PMOS transistors 13A and 13B, in accordance with variations in the configuration parameters of the transistors 11A to 13A and 11B to 13B of the bias circuit 4 which are created during manufacturing. This situation is an optimum condition for the bias circuit 4 to perform differential amplification.

With the differential amplifier 3 and the bias circuit 4 connected to each other through the bias terminal 72, the PMOS transistors 13A and 13B of the bias circuit 4 and the PMOS transistors 53A and 53B of the differential amplifier 3 form a current mirror structure.

Hence, by applying the bias voltages VB1 and VB4 under this condition, the bias circuit 4 allows the bias voltage VB1 to be directly supplied to the gates of the NMOS transistors 51A and 51B of the differential amplifier 3 and the bias voltage VB4 to determine the balance voltage $V_{BS}$ so that such the bias voltage VB5 which causes I11B=I13B (I11A= I13A) appears at the bias terminal 72.

In short, the bias voltage VB5 is controlled to an optimum voltage value which corrects the variations in the configuration parameters of the transistors 11B to 13B of the bias circuit 4 and which realizes I11B=I13B. The variations in the configuration parameters of the transistors 11B to 13B reflect the variations in the configuration parameters of the transistors 51A to 53A and 51B to 53B of the differential amplifier 3.

Thus, as in the conventional bias circuit 5, since the bias voltage VB5 is supplied to the gates of the PMOS transistors 53A and 53B of the differential amplifier 3 through the bias terminal 72, the variations regarding the transistors 51A to 53A and 51B to 53B of the differential amplifier 3 are corrected. As a result, an excellent input/output characteristic is realized.

A minimum necessary power source voltage in the bias circuit 4 is calculated as (drain-source voltage Vdsat1 for maintaining the NMOS transistor 11B (11A) saturated)+ (drain-source voltage Vdsat2 for maintaining the NMOS transistor 12B (12A) saturated)+(drain-source voltage Vdsat3 for maintaining the PMOS transistor 13B (13A) saturated)+(threshold voltage Vth2 of the NMOS transistor 12B (12A)).

On the other hand, for the structure of the differential amplifier 3, as described earlier in relation to the conventional technique, the power source voltage must be equal to or larger than (drain-source voltage Vdsat1 for maintaining the NMOS transistor 51A (51B) saturated)+(drain-source voltage Vdsat2 for maintaining the NMOS transistor 52A (52B) saturated)+(drain-source voltage Vdsat3 for maintaining the PMOS transistor 53A (53B) saturated)+(threshold voltage Vth2 of the NMOS transistor 52A (52B)).

Hence, as can be understood by comparing the bias circuit 4 with the conventional bias circuit 5, the same level as the power source voltage which is necessary for the differential amplifier 3 can be maintained by reducing (threshold voltage Vth3 of the PMOS transistor 13B (13A)).

Thus, by forming the bias circuit 4 in a circuit structure which is basically equivalent to that of the differential amplifier 3, the operating voltage of the bias circuit 4 can be set at the same level as that of the differential amplifier 3.

This makes it possible to obtain a differential amplifier circuit in which an operating power source voltage is suppressed to a minimum necessary level and which exhibits an excellent input/output characteristic.

<Second Preferred Embodiment>

Figure 4:
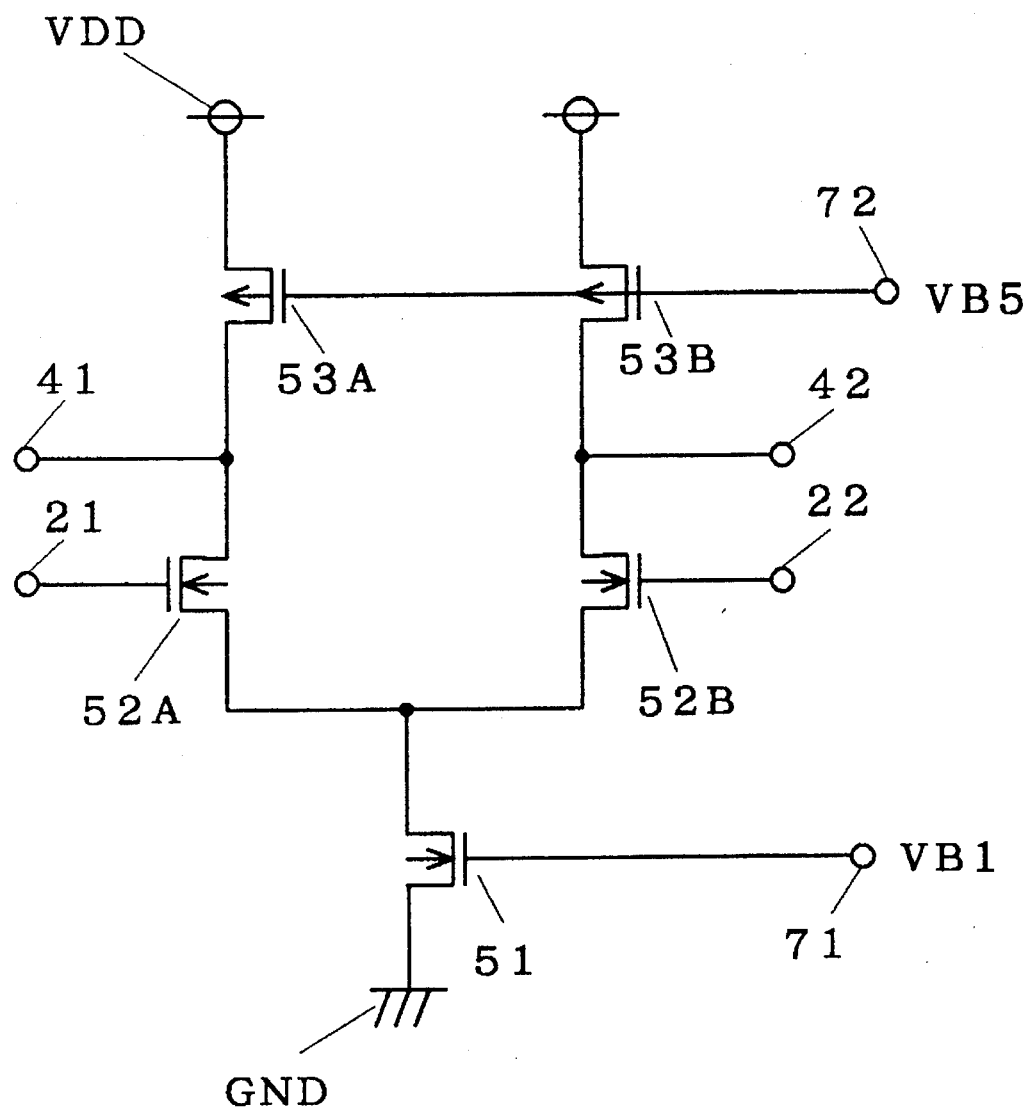
FIG. 4 is a circuitry diagram showing an inner structure of a differential amplifier of a differential amplifier circuit according to a second preferred embodiment of the present invention.

FIG. 4 is a circuitry diagram showing an inner structure of the differential amplifier 3 according to a second preferred embodiment of the present invention. The entire structure of the amplification part 2 is similar to that of the first preferred embodiment shown in FIG. 1.

As shown in FIG. 4, the differential amplifier 3 is formed by NMOS transistors 51, 52A and 52B and PMOS transistors 53A and 53B.

A source of the NMOS transistor 51 constructed as a constant current control transistor is grounded. The bias voltage VB1 is impressed on a gate of the NMOS transistor 51 through the bias terminal 71. A drain of the NMOS transistor 51 is connected to sources of the NMOS transistors 52A and 52B which are structured as output control transistors.

A gate of the NMOS transistor 52A is connected to the first input terminal 21, a drain of the NMOS transistor 52A is connected to a drain of the transistor 53A which is formed as a load current control transistor. A gate of the NMOS transistor 52B is connected to the second input terminal 22 while a drain of the NMOS transistor 52B is connected to a drain of the PMOS transistor 53B which is a load current control transistor.

The bias voltage VB5 is applied to gates of the PMOS transistors 53A and 53B through the bias terminal 72. The drain of the NMOS transistor 52A (i.e., the drain of the PMOS transistor 53A) is connected to the first output terminal 41 while the drain of the NMOS transistor 52B (i.e., the drain of the PMOS transistor 53B) is connected to the second output terminal 42. Sources of the PMOS transistors 53A and 53B are each connected to the power source VDD.

Configuration parameters of the transistors 52A and 53A (i.e., channel width/channel length) are set to be identical to those of the transistors 52B and 53B.

A configuration parameter of the NMOS transistor 51 is adjusted so as to be equal to the sum of the drain-source current value of the NMOS transistor 51A and the drain-source current value of the NMOS transistor 51B of the first preferred embodiment shown in FIG. 2.

Figure 5:
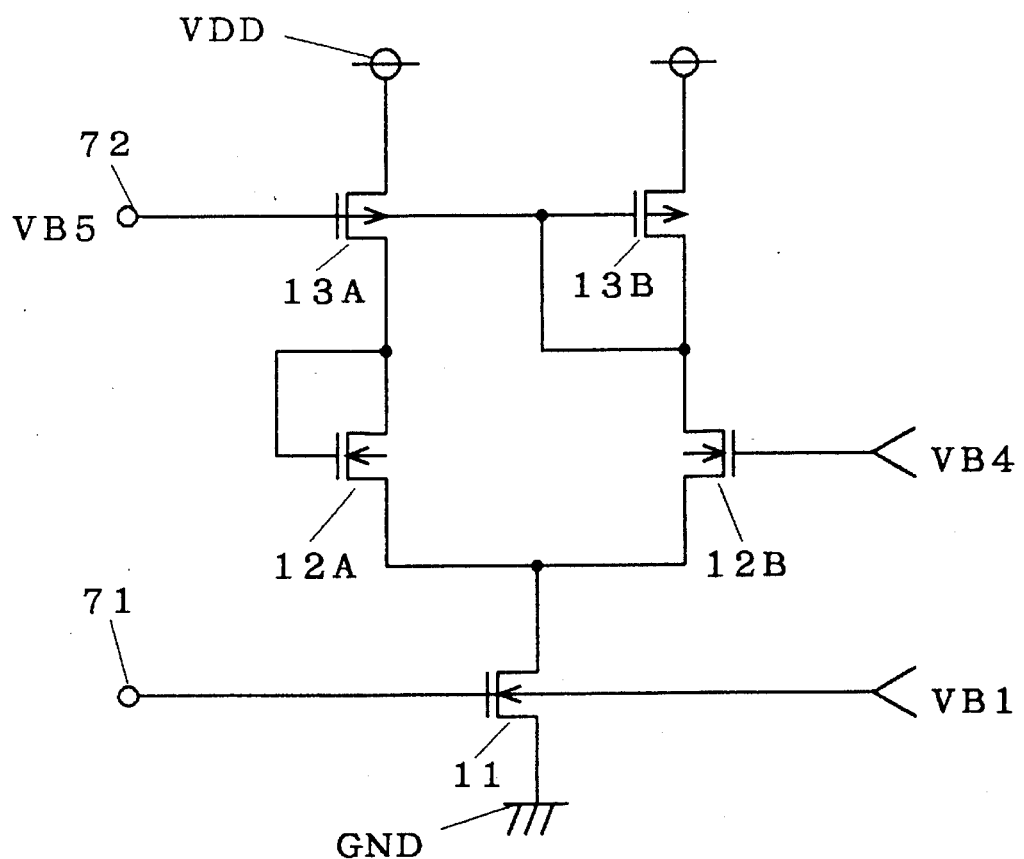
FIG. 5 is a circuitry diagram showing an inner structure of a bias circuit of the differential amplifier circuit according to the second preferred embodiment of the present invention.

FIG. 5 is a circuitry diagram showing a bias circuit of the differential amplifier circuit of the second preferred embodiment of the present invention. As shown in FIG. 5, the bias circuit of the second preferred embodiment is formed by NMOS transistors 11, 12A and 12B and PMOS transistors 13A and 13B.

A source of the NMOS transistor 11 formed as a constant current control transistor is grounded. The bias voltage VB1 is applied to a gate of the NMOS transistor 11 through the bias terminal 71. A drain of the NMOS transistor 11 is connected to sources of the NMOS transistors 12A and 12B. Hence, the NMOS transistor 11, or the constant current control transistor of the bias circuit 4, is equivalent in structure to the NMOS transistor 51 which is the constant current control transistor of the differential amplifier 3.

A gate and a drain of the NMOS transistor 12A are short-circuited to each other, and the drain (gate) of the NMOS transistor 12A is connected to a drain of the PMOS transistor 13A. On the other hand, the bias voltage VB4 is applied to the gate of the NMOS transistor 12B, and a drain of the NMOS transistor 12B is connected to the drain (gate) of the PMOS transistor 13B whose drain and gate are shared by each other.

The gates of the PMOS transistors 13A and 13B are connected to the bias terminal 72 and the sources of the PMOS transistors 13A and 13B are connected in common to the power source VDD. Hence, gate voltages of the PMOS transistors 13A and 13B are supplied to the bias terminal 72 as the bias voltage VB5.

The configuration parameter of the NMOS transistor 11 is adjusted so as to be equal to the sum of the drain-source current values of the NMOS transistors 11A and 11B of the bias circuit 4 of the first preferred embodiment. The configuration parameters of the transistors 12A and 13A are adjusted so as to be equal to the configuration parameters of the transistors 12B and 13B, respectively.

Thus, including the constant current control transistors, the bias circuit 4 of the second preferred embodiment is constructed as a voltage follower circuit which is capable of operating as a second differential amplifier which is basically equivalent to the differential amplifier 3. As in the first preferred embodiment, in the bias circuit 4 of the second preferred embodiment, the gate and the drain of the NMOS transistor 12A are short-circuited to each other and the gate and the drain of the PMOS transistor 13B are short-circuited to each other, the gate potential at the NMOS transistor 12A is controlled to be equal to the bias voltage VB4 which is supplied to the gate of the NMOS transistor 12B.

When such a bias circuit 4 is connected to the differential amplifier 3 through the bias terminals 71 and 72, the bias voltage VB4 becomes the balance voltage $V_{BS}$ of the differential amplifier 3. Thus, the balance voltage $V_{BS}$ of the differential amplifier 3 can be easily adjusted in accordance with the bias voltage VB4.

Further, since the gate potential at the NMOS transistor 12A of the bias circuit 4 is controlled to be equal to the bias voltage VB4 which is supplied to the gate of the NMOS transistor 12B, the drain-source currents between the transistors 12A and 13A become equal to the drain-source currents between the transistors 12B and 13B. As a result, half the drain-source current value I11 of the NMOS transistor 11 becomes equal to the drain-source current value I13B (I13A) of the PMOS transistor 13B (13A).

In addition, with the differential amplifier 3 and the bias circuit 4 connected to each other through the bias terminal 72, the PMOS transistor 13 of the bias circuit 4 and the PMOS transistors 53A and 53B of the differential amplifier 3 form a current mirror structure.

Hence, by applying the bias voltages VB1 and VB4 under this condition, the bias circuit 4 allows the bias voltage VB1 to be directly applied to the gates of the NMOS transistors 51A and 51B of the differential amplifier 3 and the bias voltage VB4 to determine the balance voltage VB so that such the bias voltage VB5 which causes I11/2=I13B is outputted at the bias terminal 72.

In short, the bias voltage VB5 is controlled to an optimum voltage value which corrects the variations in the configuration parameters of the transistors 11, 12B and 13B of the bias circuit 4 and which realizes I11/2=I13B. The variations in the configuration parameters of the transistors 11, 12B and 13B reflect the variations in the configuration parameters of the transistors 51A to 53A and 51B to 53B of the differential amplifier 3.

Thus, as in the conventional bias circuit 5, by supplying the bias voltage VB5 to the gates of the PMOS transistors 53A and 53B of the differential amplifier through the bias terminal 72, the variations regarding the transistors 51A to 53A and 51B to 53B of the differential amplifier 3 are corrected. As a result, an excellent input/output characteristic is obtained.

A minimum necessary power source voltage in the bias circuit 4 is calculated as (drain-source voltage Vdsat1 for maintaining the NMOS transistor 11 saturated)+(drain-source voltage Vdsat2 for maintaining the NMOS transistor 12B (12A) saturated)+(drain-source voltage Vdsat3 for maintaining the PMOS transistor 13B (13A) saturated)+ (threshold voltage Vth2 of the NMOS transistor 12B (12A)).

Hence, as can be understood by comparing the bias circuit 4 with the conventional bias circuit 5, the same level as the power source voltage which is necessary for the differential amplifier 3 can be maintained by reducing (threshold voltage Vth3 of the PMOS transistor 13B (13A)) as in the first preferred embodiment.

As a result, a differential amplifier circuit is obtained in which an operating power source voltage is suppressed to a minimum necessary level and which exhibits an excellent input/output characteristic.

<Other Modifications>

Although one bias circuit 4 is used for one differential amplifier 3 in the first and the second preferred embodiments, the amplification part 2 may be constructed to include one bias circuit 4 for a plurality of differential amplifiers 3.

While the invention has been described in detail, the foregoing description is in all aspects illustrative and not restrictive. It is understood that numerous other modifications and variations can be devised without departing from the scope of the invention.

We claim:

1. A differential amplifier circuit, comprising:

a first differential amplifier including first and second input parts, first and second output parts and a bias terminal, said first differential amplifier amplifying a potential difference between said first and said second input parts and outputting a first resultant signal from said first output part and a first inverse signal of said first resultant signal from said second output part, and a bias circuit which is connected to said bias terminal to output a bias voltage to said bias terminal, wherein said bias circuit includes a second differential amplifier which is formed on a substrate which seats said first differential amplifier, said second differential amplifier including third and fourth input parts and third and fourth output parts, said second differential amplifier amplifying a potential difference between said third and said fourth input parts and outputting a second resultant signal from said third output part and a second inverse signal of said second resultant signal from said fourth output part, said third input part and said third output part being shorted to each other, said second differential amplifier receiving a predetermined input voltage at said fourth input part and outputting said second inverse signal to said bias terminal as said bias voltage.

2. The differential amplifier circuit of claim 1, wherein said first differential amplifier includes:

a first load current control transistor having one electrode which is connected to a first power source, another electrode which serves as said first output part and a control electrode which receives a control voltage, said first load current control transistor supplying a first load current from said first power source to said first output part in accordance with said control voltage;

a second load current control transistor having one electrode which is connected to said first power source, another electrode which serves as said second output part and a control electrode which receives said control voltage, said second load current control transistor supplying a second load current from said first power source to said second output part in accordance with said control voltage;

a first output control transistor having one electrode which is connected to said first output part, another electrode and a control electrode which serves as said first input part;

a second output control transistor having one electrode which is connected to said second output part, another electrode and a control electrode which serves as said second input part; and first constant current supply means having one terminal which is connected to said another electrodes of said first and said second output control transistors and another terminal which is connected to a second power source, said first constant current supply means supplying a constant current to said second power source, said control electrodes of said first and said second load current control transistors are commonly connected to said bias terminal, said second differential amplifier of said bias circuit includes:

a voltage input terminal for receiving said predetermined input voltage;

a third load current control transistor having one electrode which is connected to said first power source, another electrode which serves as said third output part and a control electrode which receives said control voltage, said third load current control transistor supplying a third load current from said first power source to said third output part in accordance with said control voltage;

a fourth load current control transistor having one electrode which is connected to said first power source, another electrode which serves as said fourth output part and a control electrode which receives said control voltage, said fourth load current control transistor supplying a fourth load current from said first power source to said fourth output part in accordance with said control voltage;

a third output control transistor having one electrode which is connected to said third output part and a control electrode which serves as said third input part;

a fourth output control transistor having one electrode which is connected to said fourth output part and a control electrode which serves as said fourth input part; and second constant current supply means having one terminal which is connected to said another electrodes of said third and said fourth output control transistors and another terminal which is connected to said second power source, said second constant current supply means supplying a constant current to said second power source, and wherein said control electrode and said one electrode of said third output control transistor are shorted to each other, said control electrode and said another electrode of said fourth load current control transistor are shorted to each other, said control electrode of said fourth output control transistor is connected to said voltage input terminal, and said control voltage which appears at said control electrodes of said third and said fourth load current control transistors is outputted to said bias terminal as said bias voltage.

3. The differential amplifier circuit of claim 2, wherein in said first differential amplifier, configuration parameters of said first and said second load current control transistors are set to be identical to each other and configuration parameters of said first and said second output control transistors are set to be identical to each other, and in said second differential amplifier, configuration parameters of said third and said fourth load current control transistors are set to be identical to each other and configuration parameters of said third and said fourth output control transistors are set to be identical to each other.

4. The differential amplifier circuit of claim 3, wherein the configuration parameters of said third and said fourth load current control transistors and said third and said fourth output control transistors are set to be identical to the configuration parameters of said first and said second load current control transistors and said first and said second output control transistors, respectively.

5. The differential amplifier circuit of claim 3, wherein a ratio of the configuration parameters of said third and said fourth load current control transistors and said third and said fourth output control transistors is set to be identical to a ratio of the configuration parameters of said first and said second load current control transistors and said first and said second output control transistors.

6. The differential amplifier circuit of claim 4, wherein said first power source supplies a higher voltage than said second power source, said first to said fourth load current control transistors are PMOS transistors, and said first to said fourth output control transistors are NMOS transistors.

7. The differential amplifier circuit of claim 2, wherein said first constant current supply means of said first differential amplifier includes:

a second bias terminal for receiving a current control voltage;

a first constant current control transistor having one electrode which is connected to said another electrodes of said first and said second output control transistors as said one terminal, another electrode which is connected to said second power source as said other terminal and a control electrode which receives said current control voltage through said second bias terminal, said first constant current control transistor supplying a first constant current to said second power source in accordance with said current control voltage; and a second constant current control transistor having one electrode which is connected to said another electrodes of said first and said second output control transistors as said one terminal, another electrode which is connected to said second power source as said other terminal and a control electrode which receives said current control voltage through said second bias terminal, said second constant current control transistor supplying a second constant current to said second power source in accordance with said current control voltage, said second constant current supply means of said second differential amplifier of said bias circuit includes:

a third bias terminal for receiving said current control voltage;

a third constant current control transistor having one electrode which is connected to said another electrodes of said third and said fourth output control transistors as said one terminal, another electrode which is connected to said second power source as said other terminal and a control electrode which receives said current control voltage through said third bias terminal, said third constant current control transistor supplying a third constant current to said second power source in accordance with said current control voltage; and a fourth constant current control transistor having one electrode which is connected to said another electrodes of said third and said fourth output control transistors as said one terminal, another electrode which is connected to said second power source as said other terminal and a control electrode which receives said current control voltage through said third bias terminal, said fourth constant current control transistor supplying a fourth constant current to said second power source in accordance with said current control voltage.

8. The differential amplifier circuit of claim 7, wherein in said first differential amplifier, configuration parameters of said first and said second load current control transistors are set to be identical to each other, configuration parameters of said first and said second output control transistors are set to be identical to each other, and configuration parameters of said first and said second constant current control transistors are set to be identical to each other, and in said second differential amplifier, configuration parameters of said third and said fourth load current control transistors are set to be identical to each other, configuration parameters of said third and said fourth output control transistors are set to be identical to each other, and configuration parameters of said third and said fourth constant current control transistors are set to be identical to each other.

9. The differential amplifier circuit of claim 8, wherein the configuration parameters of said third and said fourth load current control transistors, said third and said fourth output control transistors and said third and said fourth constant current control transistors are set to be identical to the configuration parameters of said first and said second load current control transistors, said first and said second output control transistors and said first and said second constant current control transistors, respectively.

10. The differential amplifier circuit of claim 8, wherein a ratio of the configuration parameters of said third and said fourth load current control transistors, said third and said fourth output control transistors and said third and said fourth constant current control transistors is set to be identical to a ratio of the configuration parameters of said first and said second load current control transistors, said first and said second output control transistors and said first and said second constant current control transistors.

11. The differential amplifier circuit of claim 9, wherein said first power source supplies a higher voltage than said second power source, said first to said fourth load current control transistors are PMOS transistors, said first to said fourth output control transistors are NMOS transistors, and said first to said fourth constant current control transistors are NMOS transistors.

12. The differential amplifier circuit of claim 2, wherein said first constant current supply means of said first differential amplifier includes:

a second bias terminal for receiving a current control voltage; and a first constant current control transistor having one electrode which is connected to said another electrodes of said first and said second output control transistors as said one terminal, another electrode which is connected to said second power source as said other terminal and a control electrode which receives said current control voltage through said second bias terminal, said first constant current control transistor supplying a constant current to said second power source in accordance with said current control voltage, said second constant current supply means of said second differential amplifier of said bias circuit includes:

a third bias terminal for receiving said current control voltage; and a second constant current control transistor having one electrode which is connected to said another electrodes of said third and said fourth output control transistors as said one terminal, another electrode which is connected to said second power source as said other terminal and a control electrode which receives said current control voltage through said third bias terminal, said second constant current control transistor supplying a constant current to said second power source in accordance with said current control voltage.

13. The differential amplifier circuit of claim 12, wherein in said first differential amplifier, configuration parameters of said first and said second load current control transistors are set to be identical to each other and configuration parameters of said first and said second output control transistors are set to be identical to each other, and in said second differential amplifier, configuration parameters of said third and said fourth load current control transistors are set to be identical to each other and configuration parameters of said third and said fourth output control transistors are set to be identical to each other.

14. The differential amplifier circuit of claim 13, wherein said first power source supplies a higher voltage than said second power source, said first to said fourth load current control transistors are PMOS transistors, said first to said fourth output control transistors are NMOS transistors, and said first and second constant current control transistors are NMOS transistors.

15. A voltage comparator, comprising:

a voltage-to-be-compared input terminal for receiving a voltage-to-be-compared;

a comparing voltage input terminal for receiving a comparing voltage;

a differential amplifier circuit including first and second input terminals and first and second output terminals;

a first capacitor having one electrode which is connected to said first input terminal of said differential amplifier circuit;

a second capacitor having one electrode which is connected to said second input terminal of said differential amplifier circuit and another electrode which is grounded;

first switching means which is inserted between said voltage-to-be-compared input terminal and said first capacitor, said first switching means turning on and off in response to a first control signal;

second switching means which is inserted between said comparing voltage input terminal and said first capacitor, said second switching means turning on and off in response to a second control signal;

third switching means which is inserted between said first input terminal and said first output terminal of said differential amplifier circuit, said third switching means turning on and off in response to said first control signal; and fourth switching means which is inserted between said second input terminal and said second output terminal of said differential amplifier circuit, said fourth switching means turning on and off in response to said first control signal, wherein said differential amplifier circuit includes a first differential amplifier which has first and second input parts, first and second output parts and a bias terminal, said first differential amplifier amplifying a potential difference between said first and said second input parts and outputting a first resultant signal from said first output part and a first inverse signal of said first resultant signal from said second output part, said first and said second input parts being connected to said first and said second input terminals, respectively, and said first and said second output parts being connected to said first and said second output terminals, respectively, said differential amplifier circuit further includes a bias circuit which is connected to said bias terminal to output a bias voltage to said bias terminal, and wherein said bias circuit includes a second differential amplifier which is formed on a substrate which seats said first differential amplifier, said second differential amplifier having third and fourth input parts and third and fourth output parts, said second differential amplifier amplifying a potential difference between said third and said fourth input parts and outputting a second resultant signal from said third output part and a second inverse signal of said resultant signal from said fourth output part, said third input part and said third output part being shorted to each other, said second differential amplifier receiving a predetermined input voltage at said fourth input part and outputting a voltage which appears at said fourth output part to said bias terminal as said bias voltage.

* * * * *